United States Patent
Karaswaw et al.

(10) Patent No.: US 6,890,768 B2
(45) Date of Patent: May 10, 2005

(54) METHOD OF MAKING LAYERED SUPERLATTICE MATERIAL WITH ULTRA-THIN TOP LAYER

(75) Inventors: Junichi Karaswaw, Shimosuwa-machi (JP); Vikram Joshi, Colorado Springs, CO (US)

(73) Assignees: Symetrix Corporation, Colorado Springs, CO (US); Seiko Epson Corporation, Tokyo (JP)

( * ) Notice: Subject to any disclaimer, the term of this patent is extended or adjusted under 35 U.S.C. 154(b) by 55 days.

(21) Appl. No.: 10/471,133

(22) PCT Filed: Mar. 7, 2002

(86) PCT No.: PCT/US02/06980

§ 371 (c)(1),
(2), (4) Date: Jan. 29, 2004

(87) PCT Pub. No.: WO02/073680

PCT Pub. Date: Sep. 19, 2002

(65) Prior Publication Data

US 2004/0113186 A1 Jun. 17, 2004

Related U.S. Application Data

(60) Provisional application No. 60/285,123, filed on Apr. 20, 2001, and provisional application No. 60/274,465, filed on Mar. 9, 2001.

(51) Int. Cl.[7] .............................................. H01L 21/00
(52) U.S. Cl. ........................ 438/3; 438/238; 438/239; 438/240; 438/396
(58) Field of Search ............................. 438/3, 238–240, 438/381, 396, 694

(56) References Cited

U.S. PATENT DOCUMENTS

| | | | |
|---|---|---|---|
| 5,423,285 A | 6/1995 | Paz de Araujo | |
| 5,519,234 A | * 5/1996 | Paz de Araujo et al. | .... 257/295 |
| 5,648,114 A | 7/1997 | Paz de Araujo | |
| 5,955,754 A | 9/1999 | Azuma et al. | |
| 6,104,049 A | * 8/2000 | Solayappan et al. | ........ 257/295 |
| 6,437,380 B1 | 8/2002 | Lim et al. | |
| 6,541,279 B2 | * 4/2003 | Hayashi et al. | ................ 438/3 |
| 2001/0011738 A1 | * 8/2001 | Hayashi et al. | ............. 257/295 |

FOREIGN PATENT DOCUMENTS

| | | | |
|---|---|---|---|
| JP | 02 232974 A | | 9/1990 |
| WO | WO 94/10704 | * | 5/1994 |

OTHER PUBLICATIONS

Lim, M. et al: "Sub–100 NM SrBi2Ta2O9 Film With Ultrathin BiTaO4 Film With Ultrathin BiTaO4 Capping Layer For 3 V or Lower–Voltage Ferroelectric Memory Operation", Applied Physics Letters, Am. Institute of Physics, NY, US, vol. 81, no. 10, Sep. 2, 2002, pp. 1863–1865.

Ogata, N., et al: "Fine–Grained SrBi2TawO9 Thin Films By Low Temperature Annealing," Extended Abstracts of the International Conference On Solid State Devices And Materials, Japan Society of Applied Physics, Tokyo, Japan, Sep. 1, 1997, pp. 40–41.

* cited by examiner

Primary Examiner—Nathan J. Flynn
(74) Attorney, Agent, or Firm—Patton Boggs LLP

(57) ABSTRACT

In the manufacture of an integrated circuit memory cell, a strontium bismuth tantalate or strontium bismuth tantalum niobate thin film layer (50) is deposited on a substrate (28, 49) and a carefully controlled UV baking process is performed on the strontium bismuth tantalate layer (50) prior to the deposition of an ultra-thin bismuth tantalate layer (51). A second electrode (52) is formed on top of the ultra-thin bismuth tantalate layer (51).

18 Claims, 4 Drawing Sheets

METHOD OF MAKING LAYERED SUPERLATTICE MATERIAL WITH ULTRA-THIN TOP LAYER

This application claims the benefit of U.S. Provisional Application No. 60/274,465, filed Mar. 9, 2001 and U.S. Provisional Application No. 60/285,123, filed Apr. 20, 2001.

BACKGROUND OF INVENTION

1. Field of the Invention

This invention pertains to the fabrication of integrated circuits utilizing thin film layered superlattice material, and more particularly to processes for improving the microstructure of such thin films.

2. Statement of the Problem

Layered superlattice material thin films have been a very strong candidate for high density ferroelectric random access memories (FeRAMs). However, some problems in the layered superlattice material thin film have been pointed out, such as low remnant polarization (Pr), high crystallization temperature and surface roughness in comparison to $Pb(Zr,Ti)O_3$ (PZT) thin films. Especially, the roughness of layered superlattice material thin films, in other words, high porosity of layered superlattice material thin films, causes some damage during layered superlattice material thin film patterning processes, leading to ferroelectric memories with poor reliability.

It is known that in the chemical solution deposition (CSD) process both electrical properties of layered superlattice material and crystallinity of these materials, including surface morphology, crystal orientation, etc., are affected by the baking process. During the baking (drying) process of as-coated wet thin films, which are usually carried out on a hot plate, metalorganics in wet thin film can be partially or fully decomposed. In the prior art, surface roughness improvement by adjusting these process parameters has always been obtained at the expense of polarizability, the key property for ferroelectricity. Thus, the choice was good microstructure of the integrated circuit or high polarizability.

Ultraviolet radiation has been known to be effective in assisting chemical reactions in forming thin films. For example, see Japanese Patent Application No. 61183921 of Kamei; Japanese Patent Publication No. 60-128264 (NEC Corp.); U.S. Pat. No. 4,811,684 issued to Tashiro et al.; U.S. Pat. No. 4,683,147 issued to Eguchi et al.; Japanese Patent Publication No. 62-22420; and A. Yamada, Y. Jia, M. Konagai, and K. Takahashi, "Photochemical Vapor Deposition of $Si/Si_{1-x}Ge_x$ Strained Layer Superlattices at 250° C.", *Japanese Journal of Applied Physics*, Vol. 27, No. 11, November 1988, pp. L2174–L2176. However, while UV has been found to improve the decomposition of the precursor and improve certain crystallization factors, it also has been found to decrease polarizability. There remains a need during the fabrication of integrated circuits to improve the exposure and benefits of UV radiation versus the contrary effect on polarization characteristics of the layered superlattice material.

SUMMARY OF THE INVENTION

The invention overcomes the problems of porous surface morphology and crystal orientation in integrated circuit fabrication by depositing an ultra-thin layer of a non-ferroelectric dielectric material on top of a layered superlattice material. Preferably, the non-ferroelectric dielectric ultra-thin film is a metallic material in which the metals are selected from the metals making up the layered superlattice material. Preferably, the layered superlattice material is strontium bismuth tantalate, strontium or bismuth tantalum niobate, and the non-ferroelectric high dielectric material is bismuth tantalate. The ultra-thin layer is preferably from 5 nanometers (nm) to 70 nm thick, and most preferably from 5 nm to 35 nm thick. The addition of the ultra-thin dielectric layer results in dense materials that are resistant to degradation during subsequent processing.

The invention overcomes the problem of porous surface morphology and crystal orientation in integrated circuit fabrication by applying an exacting amount of ultraviolet (UV) radiation during the baking process of the layered superlattice material combined with deposition of an ultra-thin non-ferroelectric dielectric layer on the layered superlattice material. This UV photon energy created by the UV source during baking effectively decomposes the metalorganic compounds. Chemical bonds in metalorganic layered superlattice material solutions have various specified binding energies in accordance with each chemical bond. These binding energies are taken into consideration and the UV radiation source wavelength, UV radiation power density, and UV radiation exposure time are selected to fabricate a smoother layered superlattice material microstructure. The combination of the use of UV during the baking process with the ultra-thin top layer of a non-ferroelectric material results in dense materials that are resistant to degradation during subsequent processing, that also have excellent polarizability, low leakage current, high breakdown voltage and no fatigue up to $10^{10}$ cycles of 3.0 volt bipolar stresses.

As indicated above, the ultra-thin layer of non-ferroelectric material is preferably comprised of a plurality of metals that are elements in the layered superlattice material thin film. The non-ferroelectric dielectric is preferably deposited by use of a metal organic deposition (MOD) solution. In the preferred embodiment, first a single layer of layered superlattice material thin film is deposited, preferably by a MOD process, producing a coating of layered superlattice material over the bottom electrode of a capacitor. The coating is subjected to an exacting amount of UV radiation during the first bake, followed by a conventional second bake. These acts are repeated until the designed thickness of the layered superlattice material thin film is achieved. Optionally, a furnace anneal at 700° C. in oxygen may be performed on the baked layered superlattice material thin film; then the ultra-thin bismuth tantalate layer is deposited by MOD solution on the substrate and baked, preferably in first and second bake acts, followed by a furnace anneal.

The invention provides a method of fabricating an integrated circuit, the method comprising: providing a substrate and a first precursor containing metal moieties in effective amounts for forming a thin film of a layered superlattice material upon heating the precursor; applying the first precursor to the substrate to form a first coating; treating the first coating to form the thin film of the layered superlattice material, and completing the fabrication of the integrated circuit to include at least a portion of the thin film layered superlattice material in the integrated circuit; the method characterized by: providing a second precursor containing metal moieties in effective amounts for forming a non-ferroelectric material upon heating the second precursor; applying the second precursor to the substrate to form a second coating; and then treating the first coating comprising: applying ultra-violet radiation to the first coating; and treating the second coating; thereby forming the thin film of the layered superlattice material on the substrate and an ultra thin film of the non-ferroelectric material on the layered superlattice material; and the completing comprising completing the fabrication of the integrated circuit to include at least a portion of ultra thin film of the non-ferroelectric material on the layered superlattice material in the integrated circuit. Preferably, the act of treating the first coating comprises: a first baking act comprising baking the first coating at a temperature not exceeding 300° C. for a time period not exceeding 60 minutes while subjecting the coated substrate to an ultraviolet radiation source power density of between 0.1 mW/cm$^2$ and 10 mW/cm$^2$ for a time period of between one to five minutes. Preferably, the act of treating the first coating comprises a second baking act. Preferably, the second baking act comprises baking at a temperature not exceeding 300° C. for a time period not exceeding 60 minutes. Preferably, the act of treating the first coating comprises a rapid thermal anneal. Preferably, the rapid thermal anneal is conducted at a temperature not exceeding 800° C. for a time period not exceeding 600 seconds. Preferably, the rapid thermal anneal is conducted at a temperature of between 690° C. and 710° C. for a time period between 30 seconds and 300 seconds. Preferably, the act of treating the second coating comprises a rapid thermal anneal. Preferably, the second precursor comprises a MOD precursor. Preferably, the layered superlattice material comprises strontium bismuth tantalate or strontium bismuth tantalum niobate and the non-ferroelectric material comprises bismuth tantalate. Preferably, the ultraviolet radiation source power density is 0.73 mW/cm$^2$. Preferably, the ultraviolet radiation source wavelength is between 200 nm to 300 nm. Preferably, the ultraviolet radiation source wavelength is 254 nm. Preferably, the ultra thin film has a thickness of less than 40 nm, and most preferably, between 5 nm and 20 nm.

In another aspect, the invention provides a ferroelectric memory cell comprising: a substrate; a thin film of a ferroelectric layered superlattice material formed on the substrate, the layered superlattice material including a first metal and a second metal different than the first metal; an ultra-thin film of a non-ferroelectric dielectric material formed on the ferroelectric layered superlattice material, the non-ferroelectric material including the first and second metals; and an electrode formed on the ultra-thin film. Preferably, the layered superlattice material comprises strontium bismuth tantalate or strontium bismuth tantalum niobate, and the ultra-thin film comprises bismuth tantalate. Preferably, the ultra-thin film has a thickness of less than 40 nm, and most preferably, between 5 nm and 20 nm.

The combination of the use of UV in the formation of the layered superlattice material with an ultra-thin dielectric top layer that utilizes at least two elements of the layered superlattice material provides both a dense, non-porous material that is resistant to subsequent integrated processing and a ferroelectric with superior electronic properties. Other features, objects and advantages of the invention will become apparent from the following description when read in conjunction with the accompanying drawings.

DETAILED DESCRIPTION OF THE PREFERRED EMBODIMENT

1. Overview

Figure 1:
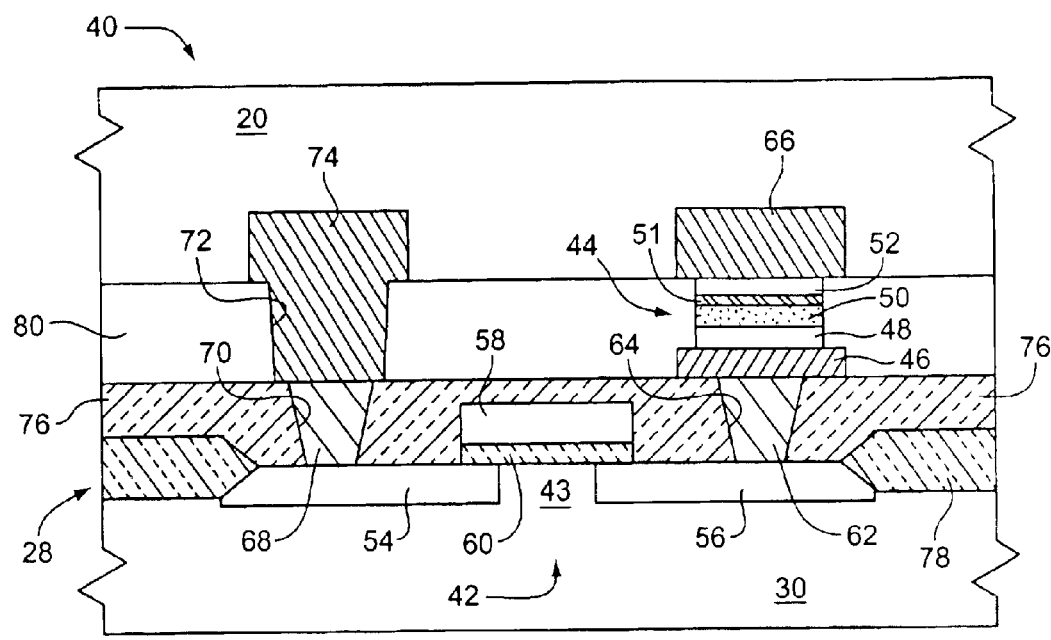
FIG. 1 depicts a cross-sectional view of an integrated circuit according to the present invention.

FIG. 1 depicts a cross-sectional view of a portion of an integrated circuit 40 which is meant to illustrate an integrated circuit in which the invention may be used. Integrated circuit portion 40 is one memory cell of a one-transistor, one-ferroelectric capacitor memory. Integrated circuit portion 40 includes transistor 42 and capacitor 44 formed on a substrate 30. Substrate 30 preferably comprises a semiconductor, such as silicon, gallium arsenide, silicon germanium, or other semiconductor, and may also include other substrate materials such as ruby, glass or magnesium oxide. In the preferred embodiment, substrate 30 is a silicon semiconductor wafer. A field oxide region 78 is formed on a surface of semiconductor substrate 30. Semiconductor substrate 30 comprises a highly doped source region 54 and a highly doped drain region 56, which are formed about a doped channel region 43. Doped source region 54, drain region 56 and channel region 43 are preferably n-type doped regions. A gate insulator 60 comprising a thin film of high dielectric constant insulator is located on semiconductor substrate 30, above channel region 43. Gate insulator 60 has a thickness in the range of from 1 nanometer (nm) to 50 nm, preferably from 5 nm to 20 nm. Source region 54, drain region 56, channel region 43, gate insulator 60 and gate electrode 58 together form a MOSFET 42.

A first interlayer dielectric (ILD) layer 76, preferably made of boron doped phospho-silicate glass (BPSG) is located on semiconductor substrate 30 and field oxide region 78. ILD 76 is patterned to form vias 70, 64 to source region 54 and drain region 56, respectively. Plugs 68, 62 are electrically conductive and typically comprise polycrystalline silicon or tungsten. An electronically conductive buffer/diffusion barrier layer 46 according to the invention is located on ILD 76 in electrical contact with plug 62. Diffusion barrier layer 46 is made of, for example, IrO$_2$ and typically has a thickness of from 1 nm to 30 nm, preferably from 1 nm to 5 nm.

As depicted in FIG. 1, a bottom electrode layer 48 is located on diffusion barrier layer 46. It is preferable that the bottom electrode contains a non-oxidized precious metal such as platinum, palladium, silver and gold. Metals such as aluminum, aluminum alloy, aluminum silicon, aluminum nickel, nickel alloy, copper alloy, and aluminum copper may also be used for electrodes of a dielectric or ferroelectric memory. In the preferred embodiment, first electrode 48 is made of platinum and has a thickness of 200 nm. Preferably, it also includes at least one adhesive layer (not shown), such as titanium, to enhance the adhesion of the electrodes to adjacent underlying or overlying layers of the circuits. Layered superlattice material layer 50, comprising a thin film of ferroelectric high dielectric constant insulator according to the invention, is located on bottom electrode layer 48. Layered superlattice material layer 50 has a thickness in the range of from 5 nm to 500 nm, preferably from 30 nm to 100 nm. An ultra-thin film of a non-ferroelectric dielectric material 51, including a plurality of metals that are elements in layered superlattice material 50, is formed atop layered superlattice material 50. A top electrode layer 52, preferably made of platinum and having a thickness of 200 nm, is formed on layered superlattice material layer 50. First electrode layer 48, layered superlattice material layer 50, ultra-thin film 51 and top electrode layer 52 together form memory capacitor 44. Diffusion barrier layer 46 inhibits the diffusion of metal atoms and oxygen from layered superlattice material layer 50 and bottom electrode 48 into semiconductor substrate 30. A second interlayer dielectric layer (ILD) 80, preferably made of nondoped silicate glass (NSG) is deposited to cover ILD 76, buffer/diffusion layer 46, and dielectric memory capacitor 44. A PSG film or a BPSG film or other suitable passivation material could also be used in layer 80. ILD 76 and ILD 80 may also be made of the layered superlattice material according to the invention. ILD 80 is patterned to form via 72 to plug 68. A metalized wiring film is deposited to cover ILD 80 and fill via 72 and then patterned to form source electrode wiring 74 and top electrode wiring 66. Wirings 74, 66 preferably comprise Al—Si—Cu standard interconnect metal with a thickness of about 200 nm to 300 nm.

It should be understood that the term "substrate" is often used ambiguously in the art of integrated circuits. Often, it is used to refer to the silicon, gallium arsenide or other wafer, such as 30 of FIG. 1, on which the integrated circuit is fabricated. Sometimes the term is used to refer to the incomplete portion of the integrated circuit on which a particular layer is formed. For example, in this sense, the substrate 28 on which capacitor 44 in FIG. 1 is formed is in general terms the incomplete integrated circuit through layer 46. At other times, the word "substrate" is used to mean the immediate layer on which a material is formed. In this sense, layer 46 is the immediate substrate on which capacitor 44 is formed. In this specification, the term "substrate" is used broadly to mean any layer on which another layer is formed. When an active layer, such as layered superlattice material layer 50 in FIG. 1, is being discussed, then substrate 49 is most generally first electrode 48 and all the layers of the incomplete integrated circuit below it.

Terms of orientation herein, such as "upward", "downward", "above", "top", "upper", "below", "bottom", and "lower", mean relative to semiconductor substrate 30. That is, if a second element is "above" a first element, it means it is farther from the substrate; and if it is "below" another element, then it is closer to semiconductor substrate 30 than the other element. A material gradient that is negative in the upward direction means that the lateral region or regions farther from semiconductor substrate 30 have less of the material. Terms such as "above" and "below" do not, by themselves, signify direct contact of one layer with an underlying layer.

The long dimension of semiconductor substrate 30 defines a plane that is considered to be a "horizontal" plane herein, and directions perpendicular to this plane are considered to be "vertical." The terms "lateral" or "laterally" refer to the direction of the flat plane of the thin film, that is, parallel to the horizontal direction.

The term "thin film" is used herein as it is used in the integrated circuit art. Generally, it means a film of less than a micron in thickness. The thin films disclosed herein are, in all instances, less than 0.5 microns in thickness. Preferably, ferroelectric thin films 50 are 100 nm to 300 nm thick, and most preferably 100 nm to 200 nm thick. These thin films of the integrated circuit art should not be confused with the layered capacitors of the macroscopic capacitor art which are formed by a wholly different process which is incompatible with the integrated circuit art.

The term "ultra-thin film" herein means a film that is less than 70 nm thick, and preferably 50 nm or less thick. The most preferred ultra-thin films according to the invention are 35 nm or less thick.

It should be understood that the integrated circuit portion 40 is merely exemplary. As known in the art, ferroelectric integrated circuit memories are usually much more complex, but the complexity has not been shown so as not to lose the invention in an overload of detail that is already known in the art. The invention contemplates that the invention may be used with any ferroelectric memory, including many other designs using ferroelectric capacitors and many designs using ferroelectric field effect transistors (FETs).

Figure 2:
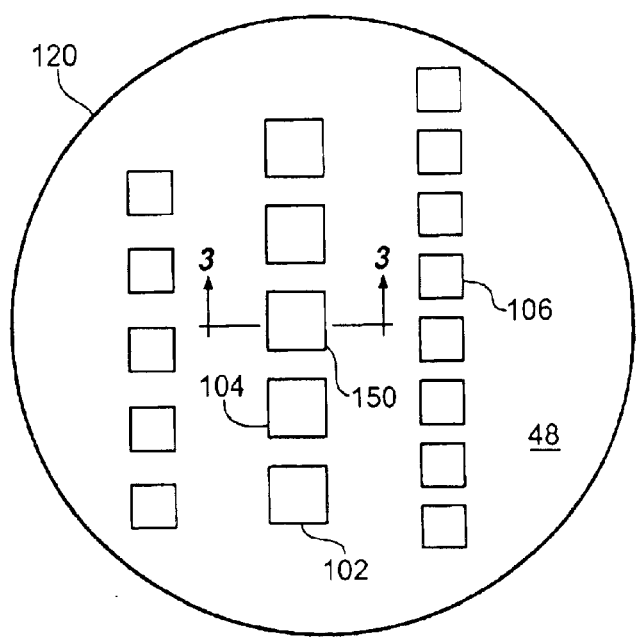
FIG. 2 depicts a top view of a wafer on which thin film capacitors fabricated by the process according to the invention are shown greatly enlarged.
Figure 3:
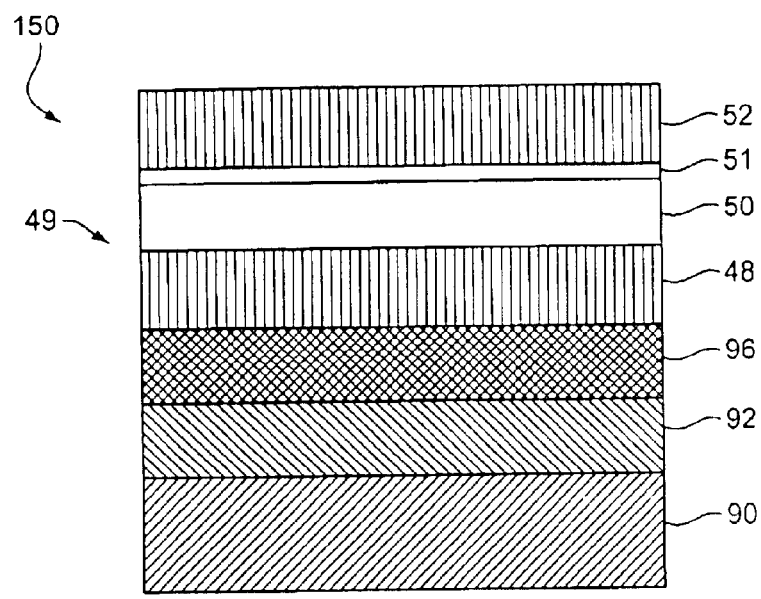
FIG. 3 is cross-sectional view of a capacitor of FIG. 3 through the line 4—4.

Directing attention to FIG. 2, a wafer 120 containing numerous capacitors 102, 106, 150, etc., is shown. FIG. 2 is a top view of wafer 120 on which thin film capacitors 102, 106, 150, etc., fabricated by the process according to the invention are shown greatly enlarged. FIG. 3 is a portion of a cross-section of FIG. 2 taken through lines 3—3 bisecting capacitor 150. Integrated circuit capacitor 150 is preferably formed on a substrate 90 that may be silicon, gallium arsenide, ruby or other semiconductor, or an insulator, such as glass or magnesium oxide (MgO), or any of the other materials mentioned above. In the preferred embodiments described herein, it is a P-type silicon wafer of about 15–20 centimeters in diameter. Preferably, it is a single crystal. Layer 92 of about 500 nm of silicon dioxide is grown on silicon wafer 90 by conventional methods, then an adhesion layer 96 of titanium is deposited above silicon dioxide layer 92. Adhesion layer 96 of titanium functions as an adhesion metal to prevent peeling of the platinum component away from the oxide layer. Tantalum, iridium and iridium oxide are also useful as adhesion metals. The titanium or other adhesion metal is typically sputtered to a thickness ranging from 10 nm to 20 nm, then first electrode 48 is formed by sputtering from 100 nm to 200 nm of platinum above adhesion layer 96. Both layers 96 and 48 are preferably formed by conventional atomic sputtering techniques, such as DC magnetron sputtering or radio frequency sputtering. The incomplete device is then annealed in an oxygen furnace, preferably for 30 minutes at 650° C. The annealing in oxygen serves, among other things, to stabilize the titanium in titanium layer 96. This incomplete device forms a substrate 49 on which the layered superlattice material 50 is formed.

A layered superlattice material layer 50 is formed of a material that is preferably having dielectric and/or ferroelectric properties. Layered superlattice material layer 50 is fabricated as described in detail below and is preferably less than about 400 nm thick, and most preferably about 200 nm thick. Layer 50 may be a perovskite, such as barium strontium titanate or strontium titanate. Layer 50 is more preferably a layered superlattice material, and is most preferably strontium bismuth tantalate or strontium bismuth tantalum niobate.

All types of layered superlattice materials may be generally summarized under the average empirical formula:

$$A1_{w1}^{+a1} A2_{w2}^{+a2} \ldots Aj_{wj}^{+aj} S1_{x1}^{+s1} S2_{x2}^{+s2} \ldots$$
$$Sk_{xk}^{+sk} B1_{y1}^{+b1} B2_{y2}^{+b2} \ldots Bl_{yl}^{+bl} Q_z^{-2} \quad (1)$$

Note that Formula (1) refers to a stoichiometrically balanced list of superlattice-forming moieties. Formula (1) does not represent a unit cell construction, nor does it attempt to allocate ingredients to the respective layers. In Formula (1), A1, A2 . . . Aj preferably represent A-site elements in a perovskite-like octahedral structure, which includes elements such as strontium, calcium, barium, bismuth, lead, and mixtures thereof, as well as other metals of similar ionic radius. S1, S2 . . . Sk represent superlattice generator elements, which preferably include only bismuth, but can also include trivalent materials such as yttrium, scandium, lanthanum, antimony, chromium, and thallium. B1, B2 . . . Bl preferably represent B-site elements in the perovskite-like structure, which may be elements such as titanium, tantalum, hafnium, tungsten, niobium, vanadium, zirconium, and other elements. Q represents an anion, which preferably is oxygen but may also be other elements, such as fluorine, chlorine and hybrids of these elements, such as the oxyfluorides, the oxychlorides, etc. The superscripts in Formula (1) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (1) includes the cases where the unit cell may vary throughout the material, e.g. in $Sr_{0.75}Ba_{0.25}Bi_2Ta_2O_9$, on the average, 75% of the time Sr is the A-site atom, and 25% of the time Ba is the A-site atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one or two B-site elements, although Formula (1) is written in the more general form because the invention is intended to include the cases where either of the A- and B-sites and the superlattice generator can have multiple elements. The value of z is found from the equation:

$$(a1w1 + a2w2 \ldots + ajwj) + (s1x1 + s2x2 \ldots + skxk) +$$
$$(b1y1 + b2y2 \ldots + bjyj) = 2z \quad (2)$$

The layered superlattice materials do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra.

The term "layered superlattice material" herein also includes doped layered superlattice materials. That is, any of the material included in Formula (1) may be doped with a variety of materials, such as silicon, germanium, uranium, zirconium, tin, chromium, dysprosium, or hafnium.

Formula (1) at least includes all three of the Smolenskii-type ferroelectric layered superlattice materials, namely, those having the respective empirical formulae:

$$A_{m-1}S_2B_mO_{3m+3}; \quad (3)$$

$$A_{m+1}B_mO_{3m+1}; \text{ and} \quad (4)$$

$$A_mB_mO_{3m+2}, \quad (5)$$

wherein A is an A-site metal in the perovskite-like superlattice; B is a B-site metal in the perovskite-like superlattice; S is a trivalent superlattice-generator metal such as bismuth or thallium; and m is a number sufficient to balance the overall formula charge. Where m is a fractional number, the overall average empirical formula provides for a plurality of different or mixed perovskite-like layers. Formula (5) is most preferred. Layered superlattice materials are described in more detail in U.S. Pat. No. 5,519,234, issued May 21, 1996 to Carlos A. Paz de Araujo et al., which is hereby incorporated by reference as though fully disclosed herein. Mixed layered superlattice materials, which are also included in the general term "layered superlattice materials", are described in detail in U.S. Pat. No. 5,955,754 issued Sep. 21, 1999 to Azuma et al., which is also incorporated by reference herein.

Layered superlattice material layer 50 is coated on the substrate by a MOD process. A MOD process includes a carboxylate or an alkoxycarboxylate as a precursor, and may also include an alkoxide. Typically, in a MOD process a first metal, an alcohol, and a carboxylic acid are reacted to form a metal alkoxycarboxylate which is then reacted with an alkoxide and/or a carboxylate of a second metal to form the precursor. A MOD process as described above is described in U.S. Pat. No. 5,514,822, issued May 7, 1996 to McMillan et al., and is hereby incorporated by reference herein. In another aspect of the invention, the first layered superlattice material layer 50 is coated on the substrate by a Sol-Gel process. As known in the art, a Sol-Gel process always includes only alkoxide precursors.

Returning to FIG. 3, a second layer 51 is deposited on top of first layered superlattice material layer 50, preferably by a MOD process. Layer 51 is a non-ferroelectric dielectric material having a plurality of metal elements that are the same as the metal elements in layered superlattice material 50. For example, if layered superlattice material 50 is strontium bismuth tantalate or strontium bismuth tantalum niobate, layer 51 is preferably bismuth tantalate. Layer 51 is baked and annealed as described below. Then a second electrode 52, preferably formed of platinum having a thickness of from about 1000 Å to 2000 Å, is formed atop layer 51, again by conventional atomic sputtering techniques.

2. Detailed Description of the Fabrication Process

Figure 5:
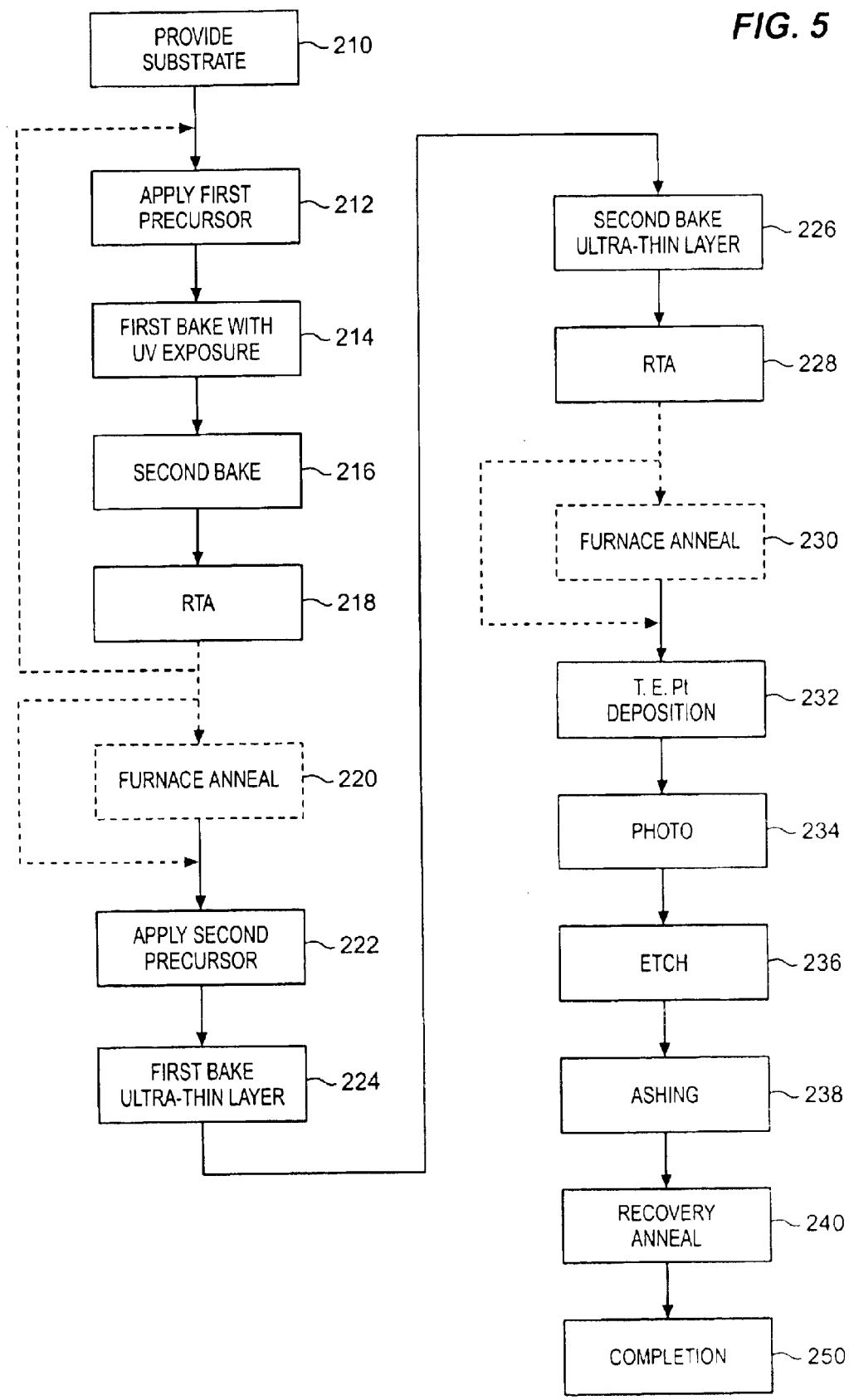
FIG. 5 is a flow chart of the process for fabricating an integrated circuit according to the invention.

FIG. 5 is a flow chart of an exemplary process according to the invention used in manufacturing integrated circuits such as in FIGS. 1–3. Act 210 preferably includes providing a substrate including wafer 90, $SiO_2$ layer 92, titanium adhesion layer 96, and first electrode 48. These components are not critical to the invention, and those skilled in the art will understand that act 210 more generally includes preparing any substrate to a point where layered superlattice material layer 50 may be applied. Layers 92, 96, as well as electrode 48, are applied by conventional techniques such as thermal oxidation for the $SiO_2$ and sputtering for the metal layers. Preferably, layer 96 is thermally oxidized in a furnace at 650° C. for a time period of 30 minutes in ambient oxygen. Preferably, the first electrode is deposited on top of oxidized layer 96 by DC sputtering to a thickness of 200 nm. Act 210 most preferably also includes prebaking the metalized substrate including electrode 48 at a temperature that is greater than or equal to the temperature of any of the subsequent process acts to be performed on the substrate as described below. This prebaking is preferably in an oxygen atmosphere, preferably in a diffusion furnace at a temperature of from about 500° C. to 1000° C. prior to applying act 212. This prebaking act removes water and organic impurities from the substrate surface. More importantly, the prebaking decreases the internal stress of platinum layer 48 through the annealing effect of the prebaking and the partial oxidation and interdiffusion of adhesion layer 96 metal.

This interaction between layers 92, 96 and 48 minimizes a potential problem of the peeling of layers 96 and 48. Further, if adhesion layer 96 is a transition metal, the partial oxidation stabilizes the metal chemically. Therefore, the number of mobile atoms penetrating into thin film layered superlattice material layer 50 through platinum layer 48 is decreased, and thin film layered superlattice material layer 50 crystallizes more smoothly, i.e., without defects due to the diffused ions. If the substrate is not metalized, then the silicon or other wafer is preferably dehydrated at a lower temperature.

Act 212 includes preparing a liquid precursor solution that is capable of forming a layered superlattice material layer 50 as ferroelectric material. The contents of the precursor solution preferably reflect relative molar proportions of polyoxyalkylated metals in amounts equivalent to the stoichiometric crystalline formula, after accounting for evaporation and sublimation losses in the manufacturing process. Further, the reaction products are preferably diluted to a molarity that will yield from 0.01 to 0.5 moles of the desired layered superlattice material compound per liter of solution. Most preferably, the reaction products concentration is 0.10 molar. The layered superlattice material of act 212 is applied to the substrate of act 210 by way of a MOD process. It is preferred to apply the solution by spinning the substrate from about 1000 RPM to about 3000 RPM, most preferably at 2500 RPM, while flowing the precursor onto the substrate at room temperature for about 20 seconds to 60 seconds, most preferably for 30 seconds. However, these parameters may vary depending upon the precursor viscosity and the desired thickness of the film. This MOD technique serves to coat a surface of the substrate with a uniform, liquid thin film of precursor solution.

Layer 50 is then baked in air or dry nitrogen, and preferably at a temperature of from about 120° C. to 500° C. for a period of time. UV radiation is applied to layer 50 during this first baking act. A subsequent act of baking at a higher temperature is then performed. Layer 50 is then exposed to a rapid thermal anneal at a temperature of from 675° C. to 700° C. for a preferred maximum time of about 40 seconds. If the resultant dried thin film is not of the desired thickness, then the deposition, baking and rapid thermal annealing acts can be repeated until the desired thickness is obtained.

Act 214 includes drying the liquid precursor film that results from act 212. The liquid thin film of precursor solution is dried by baking it in air at a temperature of from about 120° C. to about 500° C., most preferably 160° C., for a period of time sufficient to remove substantially all of the volatile organic materials from the liquid thin film and produce a solid layered superlattice material thin film 50, e.g., 30 seconds to 30 minutes, most preferably 1 minute. A multiple act drying process is useful to prevent cracking and bubbling of the thin film which can occur due to excessive volume shrinkage corresponding to an excessively rapid temperature rise. Act 214 involves a key element of the present invention in that layered superlattice material layer 50 is baked in the presence of ultraviolet radiation. More specifically, layered superlattice material layer 50 is baked in the presence of ultraviolet (UV) radiation sufficient to assist the baking process in breaking the metalorganic bonds or the other organic compounds of the precursor solution. Chemical bonds in the metalorganic strontium bismuth tantalate or strontium bismuth tantalate niobate precursor solution have various specified binding energies in accordance with each chemical bond. Therefore, after these binding energies are thoroughly taken into consideration, employed UV radiation has to be carefully chosen. The parameters involved in choosing the most effective UV radiation to apply to the layered superlattice material layer 50 are UV wavelength, UV power density, and UV exposure time and process sequence. These parameters are optimized during the baking process of layered superlattice material layer 50 to produce a smooth morphology without sacrificing the remnant polarization of layered superlattice material layer 50 performance. It is important that the UV budget, that is, the total UV energy used in the process, be carefully controlled as discussed below.

The UV radiation source has a UV wavelength of between 200 nm to 300 nm, UV exposure for a time period from 1 minute to 5 minutes, and power density from 0.1 mW/cm$^2$ to 10 mW/cm$^2$. Most preferably, the UV radiation source has a UV wavelength of 260 nm, UV exposure time period of 4 minutes, and UV power density of 1 mW/cm$^2$.

In act 216, a second baking process is utilized, whereby the thin film is dried by baking it in air at a temperature of from about 250° C. to about 500° C., most preferably 260° C., for a period of time, e.g., 30 seconds to 30 minutes, most preferably 4 minutes. UV may be optionally used in this bake also, although, if it is, the UV used in the first bake should be reduced to stay within the UV budget. Drying acts 214 and 216 are done in air or in nitrogen, preferably at low humidity of about 40% or less. Act 218 is a rapid thermal anneal of the dried layered superlattice material. For example, in the case of strontium bismuth tantalate, a rapid thermal anneal at a 100° C./second ramp rate and a maximum temperature of 725° C. for 30 seconds can be performed after the two drying stages of acts 214 and 216. Most preferably, the temperature of the rapid thermal anneal is between 675° C. and 700° C. for 30 seconds in an oxygen atmosphere. Radiation from a halogen lamp, infrared lamp, or an ultraviolet lamp provides the source of heat for the rapid thermal anneal bake act. Rapid thermal anneal act 218 is preferably performed in an oxygen atmosphere of between 20% and 100% oxygen, at a temperature of between 500° C. and 850° C., with a ramping rate of between 1° C./sec. and 200° C./sec., with a holding time of 5 seconds to 300 seconds. Substantially, all of the residual organics are burned out and/or vaporized during the rapid thermal anneal process. At the same time, the rapid temperature rise of the rapid thermal anneal promotes nucleation, i.e., the generation of numerous small crystalline grains of layers 50. These grains act as nuclei upon which further crystallization can occur. The presence of oxygen in the bake process is essential in forming these grains. Acts 212, 214, 216 and 218 are repeated until the desired thickness of the layered superlattice material is obtained.

Act 220 is an optional furnace anneal that can be performed on the substrate. In act 220, a furnace crystallizing anneal is performed on the patterned integrated circuit for purposes of forming crystalline grains in the dried layer of layered superlattice material 50 that results from acts 212, 214, 216 and 218. The optional anneal is preferably conducted in oxygen at a temperature ranging from about 700° C. to about 850° C. for 80 minutes.

Act 222 includes preparing a second liquid precursor solution that is capable of forming an ultra-thin layer of non-ferroelectric material 51. The liquid precursor solution preferably includes various polyoxyalkylated metal portions in an organic solvent. Further, the reaction products are diluted to a molarity that will yield from 0.01 to 0.5 moles of the desired non-ferroelectric material compound per liter of solution. Most preferably, the reaction products concentration is 0.05 molar. The non-ferroelectric material of act 222 is applied to the substrate of act 210 by way of a MOD process. It is preferred to apply the solution by spinning the substrate from about 1000 RPM to about 3000 RPM, most preferably at 3000 RPM, while flowing the precursor onto the substrate at room temperature for about 20 to 60 seconds, most preferably for 30 seconds. However, these parameters may vary depending upon the precursor viscosity and the desired thickness of the ultra-thin film. This MOD technique serves to coat a surface of the substrate with a uniform, liquid thin film of precursor solution.

Act 224 includes drying the liquid precursor film that results from act 222. The liquid ultra-thin film of precursor solution is dried by baking it in air at a temperature of from about 150° C. to about 500° C., most preferably 160° C., for a period of time, e.g., 30 seconds to 30 minutes, most preferably 1 minute. The time required must be sufficient to remove substantially all of the volatile organic components of the precursor compound. A multiple act drying process is useful to prevent cracking and bubbling of the thin film which can occur due to excessive volume shrinkage corresponding to an excessively rapid temperature rise.

In act 226, a second baking process is utilized, whereby the ultra-thin film is dried by baking it in air at a temperature of from about 250° C. to about 500° C., most preferably 260° C., for a period of time, e.g., 30 seconds to 30 minutes, most preferably 4 minutes. Drying acts 224 and 226 are done in air or in nitrogen, preferably at low humidity of about 40% or less. Act 228 is a rapid thermal anneal of the dried non-ferroelectric material. The process conditions for act 228 are the same as for act 218.

Act 230 is an optional furnace anneal that can be performed on the substrate of forming crystalline grains in the dried ultra-thin layer of non-ferroelectric material 51 that results from acts 222, 224, 226 and 228. The optional anneal is preferably conducted in oxygen at a temperature ranging from about 700° C. to about 850° C. for 80 minutes.

Act 232 includes sputtering second electrode 52 by any conventional technique, such as DC magnetron sputtering or radio frequency sputtering. Act 234 includes a conventional patterning of the device to form discrete circuit components of the integrated circuit as needed. More specifically, as will be understood by those skilled in the art, act 234 will preferably include the application of either a positive or negative photo resist, followed by exposure to radiation through a mask. In act 238, an etch and photo resist ashing process is performed on the substrate to remove the photo resist coating. Acts 234 and 236 preferably include the patterning of layered superlattice material 50, ultra-thin film layer 51 and first electrode 48. In act 240, a recovery anneal is then performed at 700° C. for a time period of 30 minutes in oxygen. In step 250, the integrated circuit is completed to include ferroelectric layered superlattice material 50 covered by ultra-thin non-ferroelectric film 51 in an electronic component of the integrated circuit, such as capacitor 44.

3. Examples of the Fabrication Process and Property Dependence

Below, examples of the fabrication process according to the invention as applied to a wafer 120 as shown in FIGS. 2 and 3 are given.

EXAMPLE 1

Strontium Bismuth Tantalate Deposited By MOD And Baked With UV Radiation With Bismuth Tantalate Top Layer A layered superlattice material layer 50 comprising strontium bismuth tantalate ($Sr_{0.9}Bi_{2.2}Ta_2O_9$) was fabricated on a substrate 49. A KJC-MOD strontium bismuth tantalate precursor made by Kojundo Corporation in Japan available in the United States was used. The precursor solution molarity was approximately 0.10 moles per liter. A substrate 49 comprising a single crystal silicon layer 90, a 5000 Å thick layer 92 of silicon dioxide, a 200 Å thick layer 96 of titanium, and a 2000 Å thick layer 48 of platinum was prebaked at 800° C. in a diffusion furnace for 30 minutes with an oxygen flow of 6 liters/min. The precursor solution was deposited on substrate 49 by MOD. Substrate 49 was spun at 2500 RPM for 30 seconds. The coated substrate was then placed on a hot plate and baked in air at 160° C. for 1 minute while being exposed to a UV radiation source. The UV radiation source was strictly controlled and tuned to emit a UV wavelength of 254 nm. Further, the power density of the UV radiation source was controlled to 0.73 mW/cm². The time period of UV exposure during this baking process was 4 minutes. The substrate and coating were then baked in air at 260° C. for 4 minutes. The substrate and baked coating were then transferred to a rapid thermal anneal apparatus, then a rapid thermal annealing in oxygen was conducted at 700° C. with a ramping rate of 100° C./second and a hold time of 30 seconds. The acts from deposition to rapid thermal annealing were repeated twice more.

The coated substrate was transferred to a deposition chamber, then an ultra-thin layer of bismuth tantalate having the formula $Bi_{1.1}Ta_{1.0}O_4$ was deposited on top of layer 50 by a MOD process. The ultra-thin precursor solution molarity was approximately 0.05 moles per liter. Substrate 49 was spun at 3000 RPM for 30 seconds. The sample then was transferred to a hot plate and a bake process was performed on the substrate at a temperature of 160° C. in air for 1 minute. This was followed by a second bake at a temperature of 260° C. in air for 4 minutes. The coated substrate was then transferred to a rapid thermal anneal apparatus, then a rapid thermal annealing in oxygen was conducted at 700° C. with a ramping rate of 100° C./second and a hold time of 30 seconds. Then the coated substrate was transferred to a diffusion furnace and a furnace anneal process was performed at a temperature of 700° C. for 60 minutes in an oxygen atmosphere.

The coated substrate was then transferred to a deposition chamber and a second electrode 52 was sputtered, a resist was applied, followed by a standard photo mask process, and an ion mill etch. An ashing process then followed the patterning act. Wafer 120 was then transferred to a diffusion furnace and a furnace anneal process was performed at a temperature of 700° C. for 60 minutes in an oxygen atmosphere. Finally, a standard recovery anneal was performed. The final thickness of the strontium bismuth tantalate layer was 2000 Å. This aspect of the invention produced a smoother surface morphology of the layered superlattice material in comparison to prior art fabrication processes. Further, as shown by the graphs of FIGS. 4, 6 and 7 which are discussed below, the electronic properties were excellent.

Figure 4:
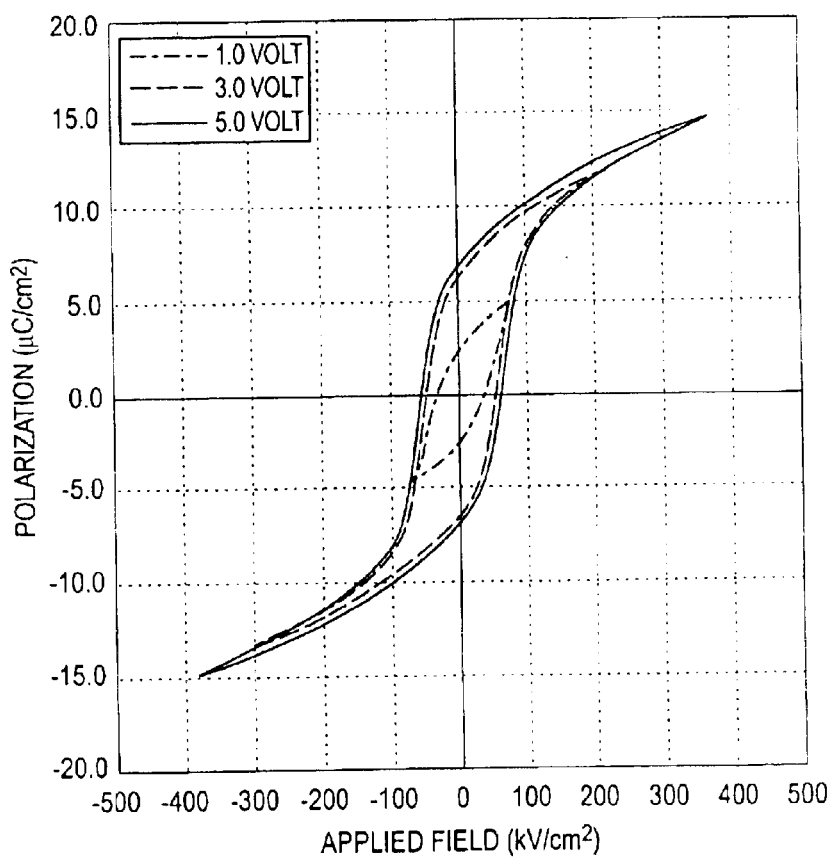
FIG. 4 is a graph of polarization in microcoulombs per centimeter squared versus applied field in kilovolts per centimeter squared for a sample of a thin film layer of SrBi$_2$Ta$_2$O$_9$ that has been subjected to exacting UV radiation during the baking act of the thin film layer of SrBi$_2$Ta$_2$O$_9$ and having an ultra-thin top layer of bismuth tantalate.

FIG. 4 shows the initial hysteresis curves for the $Sr_{0.9}Bi_{2.2}Ta_2O_9$ sample with an ultra-thin layer of bismuth tantalate fabricated in Example 1. The hysteresis curve of FIG. 4 plots polarization on the y-axis in microcoulombs per centimeter squared ($\mu C/cm^2$) versus applied field in kilovolts/cm² for voltage cycles of ±1 volts, ±3 volts, and ±3 volts. The hysteresis measurements were made on an uncompensated Sawyer-Tower circuit. As is well-known, hysteresis curves which suggest good ferroelectric properties tend to be relatively boxy and tall in the direction of polarization, rather than thin and linear. The hysteresis curves for the devices fabricated as in Example 1, including both the controlled use of UV and a top layer of bismuth tantalate over a strontium bismuth tantalate ferroelectric layer, show extremely good ferroelectric properties.

Figure 6:
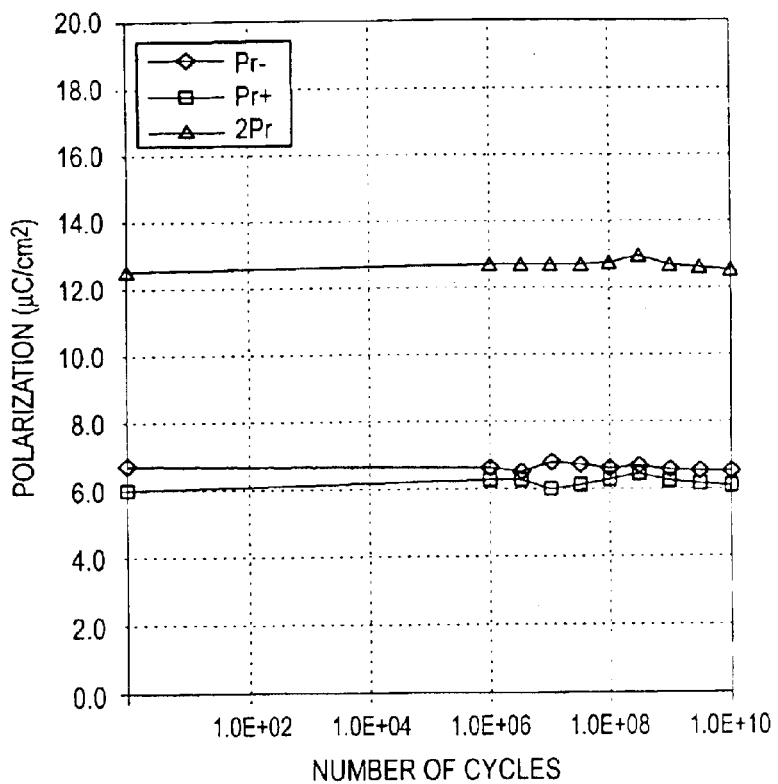
FIG. 6 is a graph of 2Pr+ and 2Pr− versus number of switching cycles for a ferroelectric capacitor as shown in FIG. 3 utilizing SrBi$_2$Ta$_2$O$_9$ as the ferroelectric material and bismuth tantalate as the ultra-thin top layer.

FIG. 6 is a graph of Pr+, Pr−, and 2Pr versus number of switching cycles for a ferroelectric capacitor made by the process of Example 1. The graph plots polarization on the y-axis in microcoulombs per centimeter squared ($\mu C/cm^2$) versus the number of switching cycles along the x-axis. The polarization charge 2Pr is the charge created by switching a capacitor such as 150 from a state where it is fully polarized in one direction, say the upward vertical direction, to the fully opposite fully polarized state, which would be a downward vertical direction. Here, "fully polarized" means the state in which the ferroelectric material has been polarized fully and the field removed. In terms of a hysteresis curve, such as shown in FIG. 4, it is the difference between Pr+, the point where the hysteresis curve crosses the positive polarization axis (y-axis), and Pr−, the point where the hysteresis curve crosses the negative polarization axis (y-axis). Unless otherwise noted, the Pr+, Pr−, and 2Pr values are taken from the hysteresis measurement at the highest voltage. A cycle is defined as the capacitor, such as 150, being switched through one square pulse. The polarization, 2Pr, is approximately twice the remnant polarization, Pr. The polarizability is not only high, but is very flat up to $10^9$ cycles showing little fatigue. These are indeed the flattest of these type of curves, showing the best fatigue results yet seen for any ferroelectric material.

Figure 7:
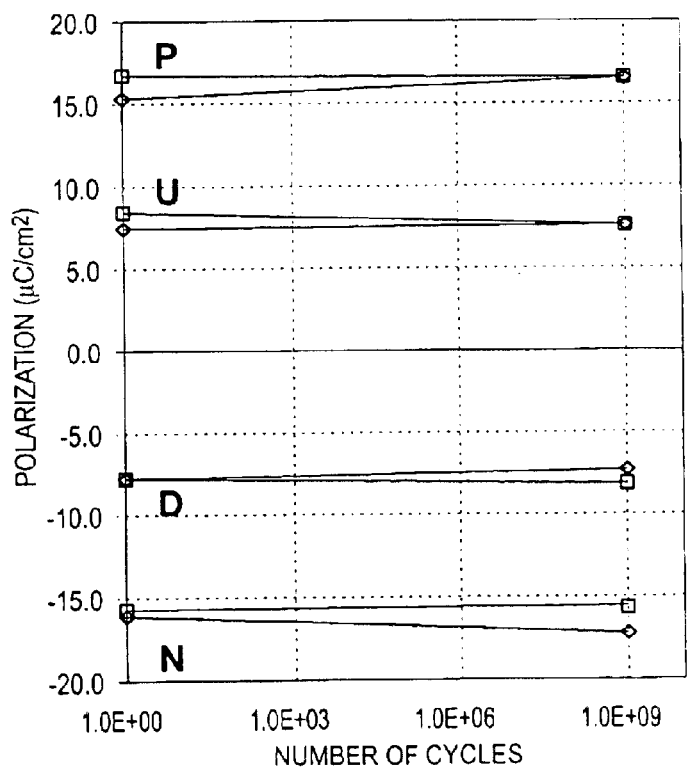
FIG. 7 is a PUND graph of polarization versus number of positive and negative switching cycles for a ferroelectric capacitor as shown in FIG. 3 utilizing SrBi$_2$Ta$_2$O$_9$ as the ferroelectric material and bismuth tantalate as the ultra-thin top layer.

FIG. 7 is a PUND graph of polarization in microcoulombs per centimeter squared ($\mu C/cm^2$) along the y-axis versus the number of switching cycles along the x-axis. The PUND curves are generated in a well-known manner by first initializing the sample with a pulse in the negative direction, then measuring the polarizability for a series of four voltage pulses that give the measurement its name: a positive (P) pulse, a second positive or up (U) pulse, a negative (N) pulse, and then another negative or down (D) pulse. All pulses have the same absolute amplitude. The initial negative pulse makes sure the material starts with a negative polarization. The first positive, "P", pulse therefore switches the material to a positive polarization. Since the sample is already polarized positively, the second, or "U", pulse measures the change between the residual polarization and the saturated polarization in the positive direction. Likewise, the "N" pulse measures the negative switching current, and the "D" pulse measures the change between the residual polarization and the saturated polarization in the negative direction. Each of the P, U, N, And D curves is very flat and shows little change with number of cycles, indicating this material will have very stable ferroelectric performance over the lifetime of a memory.

The process according to the invention provides a ferroelectric material having a surface morphology that is drastically denser and smoother than in the prior art, thereby creating less problems when patterning the capacitor of the integrated circuit. Further, the polarizability of the ferroelectric material was not decreased by the fabrication process. The dielectric breakdown voltage (VBD) was between 14 volts and 15 volts, depending on the sample. This corresponds to a break down electric field of 1.2 MV/cm.

EXAMPLE 2

Strontium Bismuth Tantalum Niobate Deposited By MOD And Baked With UV Radiation With Bismuth Tantalate Top Layer A capacitor 150 was formed by a process identical to that of Example 1, except that the layered superlattice material was strontium bismuth tantalum niobate ($Sr_{0.9}Bi_{2.2}(Ta_y, Nb_{1-y})O_9$). A KJC-MOD strontium bismuth tantalum niobate precursor made by Kojundo Corporation in Japan available in the United States was used. This sample had even more dense and smoother surface morphology than that of Example 1, with high polarizability and excellent other electric properties, though these declined a little from that of Example 1.

EXAMPLE 3

Strontium Bismuth Tantalate Deposited By Sol-Gel And Baked With UV Radiation With Bismuth Tantalate Top Layer A capacitor 150 was formed by a process identical to that of Example 1, except that the precursor solution was deposited on substrate 49 by a Sol-Gel process. A Sol-Gel process always includes only alkoxide precursors. The precursor was a commercially available alkoxide precursor of strontium bismuth tantalate available from Tokyo Oka in Japan and available in the United States. The results were similar to that of Example 1, though not quite as good for all parameters.

EXAMPLE 4

Strontium Bismuth Tantalum Niobate Deposited By Sol-Gel and Baked With UV With Bismuth Tantalate Top Layer A capacitor 150 was formed by a process identical to that of Example 2, except that the Sol-Gel process was employed for depositing the layered superlattice material. The precursor was a commercially available alkoxide precursor of strontium bismuth tantalate niobate available from Tokyo Oka in Japan and available in the United States. The results were similar to that of Example 2, though not quite as good for all parameters.

EXAMPLE 5

Strontium Bismuth Tantalate Deposited By MOD With Bismuth Tantalate Top Layer

A series of capacitors 150 were formed by a process identical to that of Example 1, except that there was no UV used in the process. The bismuth tantalate MOD precursor was used with various molarities; i.e., with molarities of 0.03M, 0.04M, 0.05M, 0.06M, and 0.07M. The polarizability, 2Pr, of the strontium bismuth tantalate ferroelectric with a bismuth tantalate ultra-thin film over layer made with the 0.03M precursor was over 15 $\mu C/cm^2$, and the leakage current, break down voltage and fatigue were still excellent, though not quite as good as the process with the UV treatment. The polarizability declined with increasing molarity to under 11 $\mu C/cm^2$ for the molarity of 0.07M. The polarizability for the 0.05 M precursor was essentially the same as for the process of Example 1, but the other electrical properties were not quite as good, though still in the excellent range.

EXAMPLE 6

Strontium Bismuth Tantalum Niobate Deposited By MOD With Bismuth Tantalate Top Layer A series of capacitors 150 were formed by a process identical to that of Example 5, except that a KJC-MOD strontium bismuth tantalum niobate precursor was used. The density and smoothness of the resulting ferroelectric layer was slightly better than that for Example 5, and the other electric properties were still excellent, though slightly declined from that of the samples of Example 5.

By employing an ultra-thin layered non-ferroelectric material top layer based on MOD solution on layered superlattice material thin films exposed to UV radiation during the first baking act, improvement of the surface morphology was confirmed, without any drop of electrical properties.

Electrical properties of the layered superlattice material thin films with a bismuth tantalate layer strongly depends on the thickness of the bismuth tantalate layer, owing to its non-ferroelectricity. Very precise control of the bismuth tantalate film thickness is necessary. After optimization of thickness of the bismuth tantalate top layer, the same 2Pr properties as those derived without a bismuth tantalate top layer and an almost flat film surface were obtained. However, the insulation breakdown voltage was drastically improved up to more than 10 volts.

The strontium/bismuth ratios of the various layered superlattice materials were also varied in the above examples. Comparing the films with the strontium/bismuth ratio of 0.9/2.2 and 0.9/2.3, the more bismuth-rich base film combined with the bismuth tantalate top layer was favorable for improving the surface morphology.

UV exposure (UV wavelength is approximately 254 nm and UV power density is 0.73 mW/cm2) during the baking process successfully resulted in improvement of the layered superlattice material surface roughness. Especially, UV exposure after the first baking process at 160° C. had a great effect on improvement of the surface morphology; however, 2Pr is reduced at the same time if too much UV is used. This phenomenon was caused by its C-axis orientation. The improvement on surface morphology was not seen until after a UV exposure of about 83 millijoules per square centimeter (mJ/cm2). After an exposure of 100 mJ/cm2, the drop of 2Pr became significant. Thus, the total energy of UV exposure has to be precisely controlled. Too little UV exposure results in no change of surface roughness, and too much UV exposure leads to a drastic drop of 2Pr. The UV energy has to be strong enough to break the bonds of any metalorganic or the other organics but not strong enough to result in C-axis orientation. Applying UV exposure to only the first layer is the best way both to improve the surface morphology and reduce the drop of 2Pr.

From the above and other examples, it has been determined that the UV budget should be within the following parameters: the wavelength should be between 200 nm to 300 nm, preferably about 254 nm; the time for application of UV should be between 1 minute and 5 minutes, preferably about 4 minutes; and the power density should be from 0.1 mW/cm$^2$ to 10 mW/cm$^2$, preferably about 0.73 mW/cm$^2$.

By employing a combination of the above-described "UV exposure process" and the above-described "bismuth tantalate top layer process", the most reliable thin strontium bismuth tantalate based films can be prepared.

There has been described what are at present considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Many other ferroelectric memory structures can be used. Further, now that the advantages and workability of the combination of UV exposure during baking and an ultra-thin non-ferroelectric top layer having a plurality of elements shared with the layered superlattice thin film have been demonstrated, many other layered materials may be utilized. The present embodiments are, therefore, to be considered as illustrative and not restrictive. The scope of the invention is indicated by the appended claims.

We claim:

1. A method of fabricating an integrated circuit, said method comprising: providing a substrate and a first precursor containing metal moieties in effective amounts for forming a thin film of a layered superlattice material upon heating said precursor; applying said first precursor to said substrate to form a first coating; treating said first coating to form said thin film of said layered superlattice material, and completing the fabrication of said integrated circuit to include at least a portion of said thin film layered superlattice material in said integrated circuit; said method characterized by:

providing a second precursor containing metal moieties in effective amounts for forming a non-ferroelectric material upon heating said second precursor;

applying said second precursor to said substrate to form a second coating; and said treating said first coating comprising: applying ultraviolet radiation to said first coating; and treating said second coating; thereby forming said thin film of paid layered superlattice material on said substrate and an ultra-thin film of said non-ferroelectric material on said layered superlattice material; and said completing comprising completing the fabrication of said integrated circuit to include at least a portion of ultra-thin film of said non-ferroelectric material on said layered superlattice material in said integrated circuit.

2. A method as in claim 1 wherein said act of treating said first coating comprises: a first baking act comprising baking said first coating at a temperature not exceeding 300° C. for a time period not exceeding 60 minutes while subjecting said coated substrate to an ultraviolet radiation source power density of between 0.1 mW/cm2 and 10 mW/cm2 for a time period of between one to five minutes.

3. A method as in claim 2 wherein said first baking act is conducted in air.

4. A method as in claim 2 wherein said act of treating said first coating comprises a second baking act.

5. A method as in claim 4 wherein said second baking act comprises baking at a temperature not exceeding 300° C. for a time period not exceeding 60 minutes.

6. A method as in claim 1 wherein said act of treating said first coating comprises a rapid thermal anneal.

7. A method as in claim 1 wherein said act of treating said second coating comprises a rapid thermal anneal.

8. A method as in claims 6 or 7 wherein said rapid thermal anneal is conducted at a temperature not exceeding 800° C. for a time period not exceeding 600 seconds.

9. A method as in claim 8 wherein said rapid thermal anneal is conducted at a temperature of between 690° C. and 710° C. for a time period between 30 seconds and 300 seconds.

10. A method as in claims 6 or 7 wherein said rapid thermal anneal is conducted in oxygen.

11. A method as in claim 1 wherein said second precursor comprises a MOD precursor.

12. A method as in claim 1 wherein said layered superlattice material comprises strontium bismuth tantalate or strontium bismuth tantalum niobate.

13. A method as in claim 12 wherein said non-ferroelectric material comprises bismuth tantalate.

14. A method as in claims 1 or 13 wherein said ultra-thin film has a thickness of less than 40 nanometers.

15. A method as in claim 14 wherein said ultra-thin film has a thickness between 5 nm and 20 nm.

16. A method as in claim 1 wherein said ultraviolet radiation source power density is 0.73 mW/cm2.

17. A method as in claim 1 wherein said ultraviolet radiation source wavelength is between 200 nm to 300 nm.

18. A method as in claim 1 wherein said ultraviolet radiation source wavelength is 254 nm.

* * * * *

UNITED STATES PATENT AND TRADEMARK OFFICE
CERTIFICATE OF CORRECTION

PATENT NO.     : 6,890,768 B2                                    Page 1 of 1
DATED          : May 10, 2005
INVENTOR(S)    : Junichi Karasawa and Vikram Joshi It is certified that error appears in the above-identified patent and that said Letters Patent is hereby corrected as shown below:

Title page,
Item [75], Inventors, delete "Junichi Karaswaw" and replace it with -- Junichi Karasawa --.

Signed and Sealed this

Eighth Day of November, 2005

JON W. DUDAS
*Director of the United States Patent and Trademark Office*